United States Patent [19]

Yamada

[11] Patent Number: 4,892,761
[45] Date of Patent: Jan. 9, 1990

[54] SURFACE TREATMENT METHOD AND APPARATUS THEREFOR

[75] Inventor: Takuma Yamada, Moriyama, Japan

[73] Assignee: Dainippon Screen Mfg. Co., Ltd., Kyoto, Japan

[21] Appl. No.: 228,863

[22] Filed: Aug. 4, 1988

Related U.S. Application Data

[63] Continuation of Ser. No. 906,401, Sep. 9, 1986, abandoned.

[30] Foreign Application Priority Data

Oct. 1, 1985 [JP] Japan ................................ 60-219868

[51] Int. Cl.⁴ ............................................. B05D 1/18
[52] U.S. Cl. .................................. 427/430.1; 118/429; 134/57 R; 134/60
[58] Field of Search ................... 118/698, 697, 425, 73, 118/429, 696, 699, 704, 706; 427/309, 444, 430.1; 134/57 R, 60; 8/158; 156/345; 364/490, 488, 489, 478, 500, 164, 165, 468; 437/230

[56] References Cited

U.S. PATENT DOCUMENTS

| | | | |
|---|---|---|---|
| 2,386,079 | 10/1945 | Weiskopf | 118/425 X |
| 3,165,108 | 1/1965 | Elliott et al. | 118/429 X |
| 3,641,906 | 2/1972 | Orr et al. | 134/57 R |
| 3,751,223 | 8/1973 | Bergholtz | 8/155.1 |
| 3,969,074 | 7/1976 | Chung | 68/62 X |
| 3,986,518 | 10/1976 | Sato | 134/57 R |
| 4,374,681 | 2/1983 | Schueneman | 118/697 X |
| 4,377,986 | 3/1983 | Juve | 118/425 X |
| 4,406,248 | 9/1983 | Araki et al. | 118/429 X |
| 4,568,576 | 2/1986 | Minnie, Jr. et al. | 427/430.1 |

FOREIGN PATENT DOCUMENTS 0150974 12/1977 Japan .

OTHER PUBLICATIONS

Masakatsu Natamura and Mitsuo Ai (editors); "Overall Technology Review for Automation Systems for Modern Semiconductor Plants"; published by Science Forum Co., Ltd.; Jul. 25, 1984; pp. 62–68, with english translation.

Primary Examiner—Shrive Beck
Assistant Examiner—Alain Bashore
Attorney, Agent, or Firm—Lowe, Price, LeBlanc, Becker & Shur

[57] ABSTRACT

Time periods required for dipping semiconductor wafers in a treatment liquid in a treatment bath and for replacing the treatment liquid etc. are previously stored in a memory. Based on these data, the expected clock time when the semiconductor wafers reach each treatment bath is calculated and the replacement of the treatment liquid and transporation of the wafers are controlled on the basis of these data and the expected clock time.

4 Claims, 4 Drawing Sheets

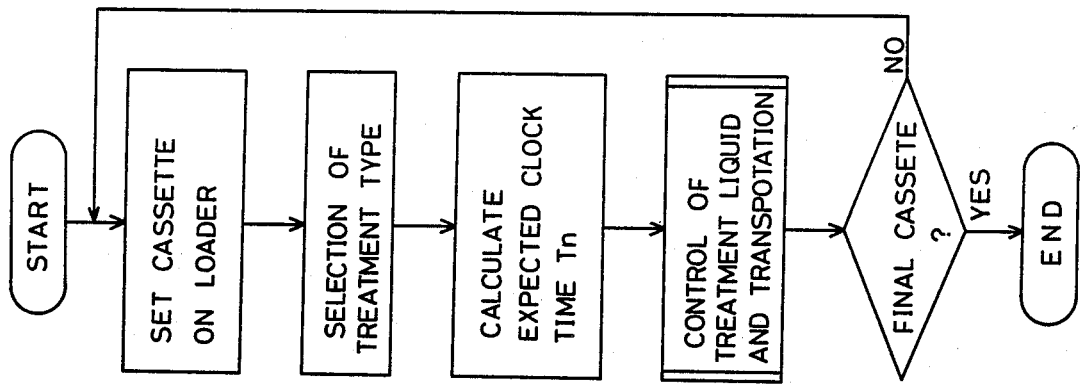
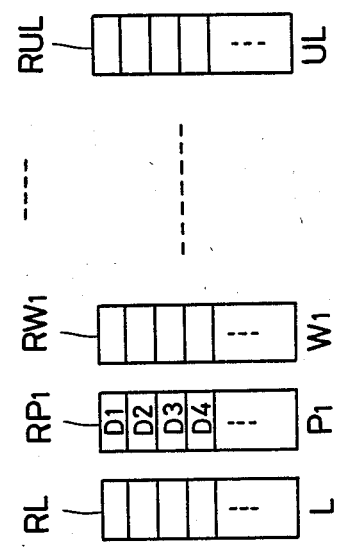

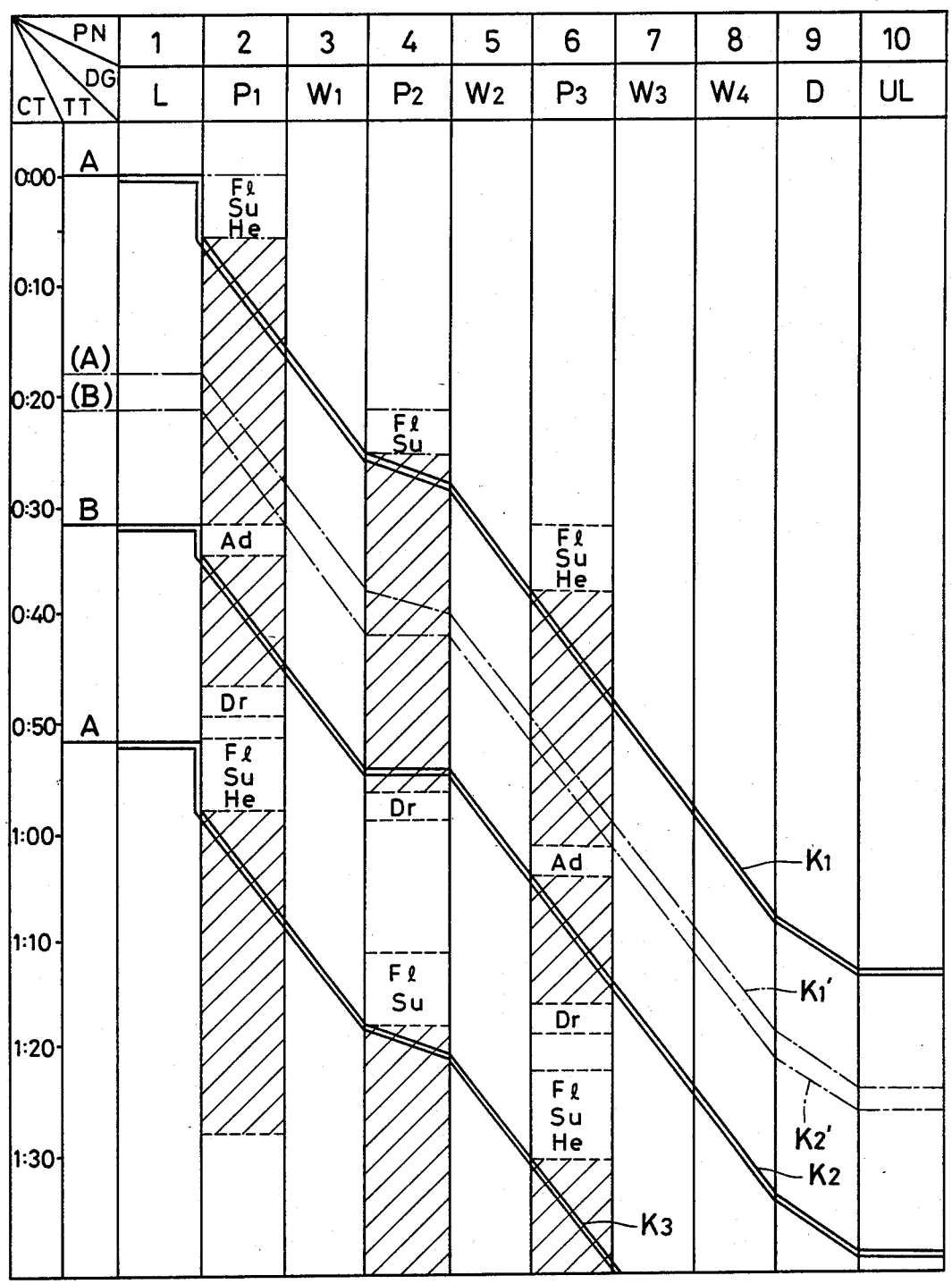

SURFACE TREATMENT METHOD AND APPARATUS THEREFOR

This application is a continuation of application Ser. No. 906,401, filed Sept. 9, 1986 now abandoned.

BACKGROUND OF THE INVENTION

1. Field of the Invention

The present invention relates to a surface treatment method and apparatus therefor for liquid treating semiconductor wafers or other objects.

2. Description of the Prior Art

As is well known, various surface treatments with liquid chemicals such as etching, photo-resist film removal and water cleaning of wafers are carried out in production lines of semiconductor devices. For example, Japanese Patent Laying Open Gazette No. 52-150974 (1977) discloses an apparatus for executing these series of surface treatments automatically, wherein various treatment baths and a drier are arranged in a line and a transfer machine travelling along the line is provided. Cassettes holding a plurality of wafers are suspended by a handling mechanism of this transfer machine and successively dipped into baths of treatment liquids. Such a treatment sequence is followed automatically in response to command signals supplied from a controller consisting of a microcomputer and other components.

However, in such a conventional apparatus, because the take-in operation of the cassettes must be interrupted during replacement and addition of the treatment liquids in the baths, the cassette flow becomes intermittent, resulting in low processing efficiency.

In particular in some surface treatments such as in multistage surface cleaning processes, types, concentrations and temperatures of the cleaning liquids and further treatment periods and treatment orders must be differentiated according to the stage where the wafers are present in the production line. This results in various combinations of treatment conditions. Therefore, if all these treatments are carried out in a conventional apparatus, the treatment sequence must be changed from one to another after all treatments for one cassette are completed and then the next cassette is fed onto the treatment line. Therefore, the next cassette must wait for a while at a loader, resulting in a substantial decrease of the efficiency of the treatments as a whole.

Moreover, replacement of the treatment liquid must be carried out, taking several factors such as time lapse from the proceeding replacement and number of dippings of the cassettes into consideration. This control of treatment liquids has been managed manually or semiautomatically. Therefore, the lifetime of a new replaced liquid is disadvantageously consumed before the next cassette is dipped and the liquid must be replaced by new liquid. Moreover, insufficient control of treatment liquid causes deviation of the treatment quality of the wafers depending on the cassette in which the same is held, degrading uniformity.

These problems are caused not only in the surface treatment of semiconductor wafers, but in several other surface treatments such as surface treatment of the glass substrates of etching masks.

SUMMARY OF THE INVENTION

The present invention is directed to a surface treatment method for transporting an object along a treatment bath train containing at least one treatment bath and dipping said object in treatment liquid supplied in the treatment bath in accordance with a predetermined order.

According to the present invention, the surface treatment method comprises the steps of calculating an expected clock time of the treatment of the object in the treatment bath at a predetermined time before treatment at the treatment bath is started, transporting the object along the treatment bath train and dipping the object in the treatment liquid bath while controlling the treatment liquids on the basis of the expected clock time.

In a preferred embodiment of the present invention, the expected clock time is a clock time when the object reaches the treatment bath and the dipping thereof is started. The control of the treatment liquid may include either replacing or adding the treatment liquid if it is determined that at least one of (a) the lifetime of the treatment liquid and (b) the allowed dipping number of the object in the treatment liquid has expired before the time when the next object is dipped in the corresponding treatment bath.

Accordingly, an object of the present invention is to provide a surface treatment method and apparatus thereof with improved efficiency, without any long interruption of the surface treatment for liquid replacement or for other processing liquid control.

Another object of the present invention is to improve the overall processing efficiency where one of a plurality of types of treatment sequences should be selectively applied according to the objects to be liquid treated.

A still further object of this invention is to carry out optimum treatment liquid control for preventing the waste thereof and maintaining the uniformity of object quality.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a schomatic representation of a relationship among registers provided in the embodiment, FIG. 4 is a flow chart showing the overall operation of the embodiment, FIG. 6 is a timing chart showing loci of cassettes holding a semiconductor lot.

DESCRIPTION OF PREFFERRED EMBODIMENT

At first, the construction of an embodiment of the present invention and data required for an operation thereof are shown and then setting/resetting of the expected treatment clock time will be described, followed by a description of treatment liquid control.

A. Construction of an Embodiment

Figure 1:
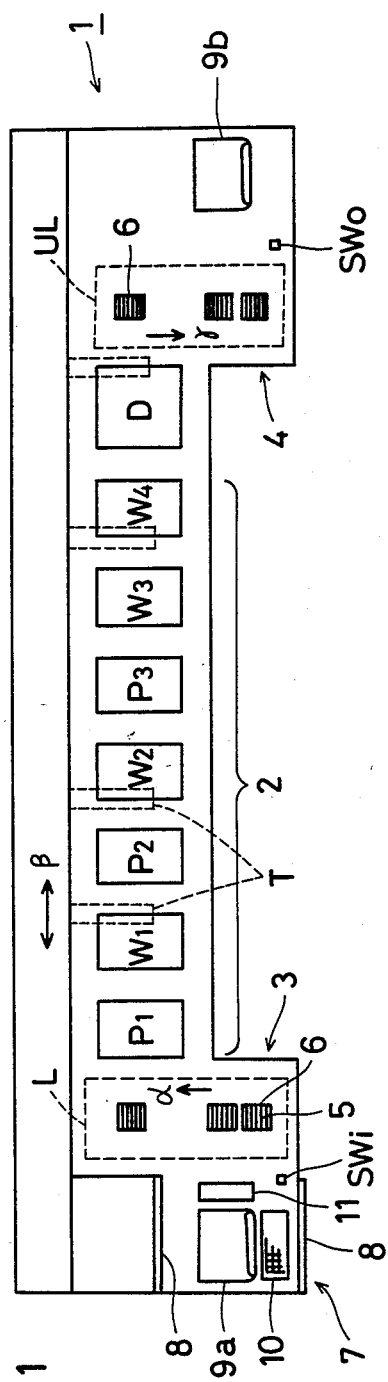
FIG. 1 is a plan view for an embodiment of this invention.

FIG. 1 is a plan view of an embodiment of this invention applied to a surface treatment apparatus of semiconductor wafers or substrates. In FIG. 1, the apparatus 1 is a so-called multi-bath batch type surface treatment apparatus having a construction for RCA cleaning, which is described, for instance, in "Overall Technology Review for Automation Systems for Modern Semiconductor Plants" pp. 63 et seq., published by "Science Forum", on July 25th 1985.

In accordance with processes of this RCA cleaning, the apparatus 1 is provided with a treatment bath train 2 consisting of seven treatment baths $P_1, W_1, P_2, \ldots W_4$ in a draft chamber (not shown). The details of these baths are as follows;

| | |
|---|---|
| Treatment bath $P_1$ | For cleaning with ammonia and hydrogen peroxide solution |
| Treatment bath $P_2$ | For cleaning with dilute fluoric acid |
| Treatment bath $P_3$ | For Cleaning with hydrochloric acid and a hydrogen peroxide solution |
| Treatment bath $W_1 W_4$ | For rinsing with pure water |

Furthermore, the last stage (right side in FIG. 1) of this treatment bath train 2 is provided with a drier D for drying cleaned wafers.

Both ends of the bath train 2 are provided with terminals 3 and 4 respectively, and a cassette 6 receiving the semiconductor wafers 5 to be treated is supplied in the first terminal 3. The cassette 6 is transported in a direction $\alpha$ in FIG. 1 to end part of the treatment bath train 2 by a loader L. Then, the cassette 6 is directed to these treatment baths by a transporting machine T transporting the same in a direction $\beta$ along the treatment bath train 2. When the dipping in each treatment bath is completed, the semiconductor wafers 5 in the cassette 6 are dried by the drier D and transferred to the unloader UL located at the second terminal 4. This unloader UL is used to transport the treated cassette 6 in direction $\gamma$ in FIG. 1 and keep the cassette 6 waiting at the transported position thereof, until delivery thereof to the outside is conducted.

The first terminal 3 is also provided with a control system 7 for controlling the aforementioned mechanism and electrical components, which comprises an operation panel 8, CRT 9a, a keyboard 10 and a floppy disc drive unit 11 and includes a control circuit (not shown in FIG. 1) to be described later. The second terminal 4 is similarly provided with a CRT 9b. Also provided are switches SWi and SWo to be operated respectively when take-in and take-out of the cassette 6 are completed and confirmed by an operator.

Figure 2:
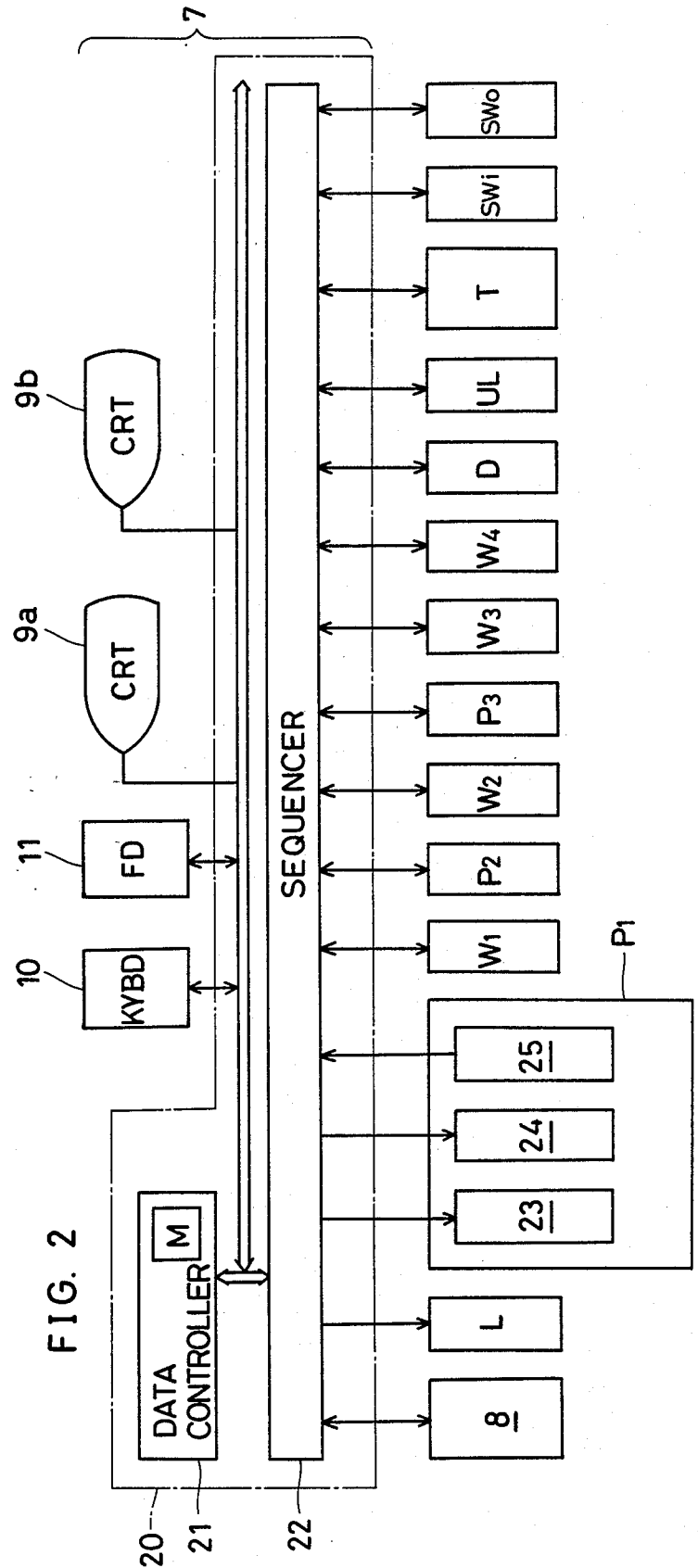
FIG. 2 is a block diagram of a circuit for carrying out one embodiment of the invention.

FIG. 2 is a schematic block diagram showing the electric construction of the apparatus 1. In FIG. 2, the control circuit 20 included in the control system 7 comprises a data controller 21 consisting of microcomputer as well as other components and a sequencer 22 connected to the data controller 21. The data controller 21 in turn is connected to the CRTs 9a and 9b, the keyboard 10 and the floppy disc drive unit 11.

On the other hand, the sequencer 22 is provided for controlling the operations of the transporting machine T, the respective treatment baths $P_1, W_1 \ldots$, the drier D, the loader L and the unloader UL. With respect to a part corresponding to the treatment bath $P_1$, for instance, the sequencer 22 is connected to a solenoid valve 23 which is used for replacing and/or adding the treatment liquid in the treatment bath $P_1$, a level sensor (not shown), a thermostat 24 for controlling the treatment liquid temperature and a photoelectric sensor 25 which detects the presence or absence of the cassette 6 in the treatment bath $P_1$. The same operation of the sequencer 22 also applies to the other treatment baths. However, there is no thermostat for the treatment bath $W_1 \sim W_4$, since they are water scouring baths.

Moreover, the sequencer 22 comprises registers RL, $RP_1 RW_1 \ldots$ RUL shown in FIG. 3 corresponding to the loader L, the respective treatment baths and the unloader UL, respectively. The registors store the data $D_1, D_2 \ldots$ (to be described later) representing the processing sequence of the cassette found presently in the corresponding treatment baths.

B. Example of Treatment Type and Required Data in Multi-processings

Now surface treatment types and an example of various data to be previously specified and stored in a memory M provided in the data controlller 21 will be described as a presupposition for describing the operations later.

The apparatus 1 is available for multi-processing, wherein numbers and types of the treatment liquids to be used for the dipping are changed according to a stage in the production line where the semiconductor wafers in the cassette 6 are found. Five types of treatment sequences are indicated in Table 1, wherein treatment baths to be used for dipping are marked by (o) while treatment baths not used for dipping are marked by (x). For example, in the case of treatment type A in Table 1, the cassette 6 should be dipped in all treatment baths $P_1, W_1 \ldots, W_4$. In the case of treatment type B, baths other than the treatment bath $P_2$ are used for dipping. The treatment baths used for dipping are similarly specified for the treatment types $C \sim E$.

TABLE 1

| | L | $P_1$ | $W_1$ | $P_2$ | $W_2$ | $P_3$ | $W_3$ | $W_4$ | D | UL |
|---|---|---|---|---|---|---|---|---|---|---|
| A | o | o | o | o | o | o | o | o | o | o |
| B | o | o | o | X | o | o | o | o | o | o |
| C | o | X | X | o | o | o | o | o | o | o |
| D | o | o | o | o | o | X | X | o | o | o |
| E | o | o | o | X | o | X | X | o | o | o |

The data corresponding to the contents of Table 1 are previously stored in memory M of data controller 21. When one of these types is selected from the keyboard 10 through a menu, the corresponding processing sequence is called.

In operations described later, the data for treatment time periods (i.e., time periods required for dipping) in each treatment bath are also required. An example thereof is shown in the third row of Table 2 for respective treatment baths indicated in the second row of the corresponding column. In Table 2, the "Position Number" is assigned to the loader L, each treatment bath and the unloader UL along the transporting direction of the cassette 6 and ". . ." indicates an omitted description. The meanings of the other symbols indicated in Table 2 are described in Table 2A and the details of Table 2 will be described later.

TABLE 2

| Process No. | Designation Treatment Time (min) | | Position Number | | | | | | | | | |
|---|---|---|---|---|---|---|---|---|---|---|---|---|
| | | | 1 Loader L — | 2 Treatment Bath $P_1$ 10 | 3 $W_1$ 10 | 4 $P_2$ 2 | 5 $W_2$ 10 | 6 $P_3$ 10 | 7 $W_3$ 10 | 8 $W_4$ 10 | 9 Drier D ... | 10 Unloader UL — |
| I | Setting of Expected Clock Time at the Take-in Time of the Object to The Loader | Ta Tb Tc Td | (0:00) | 0:00 0:00 0:06 0:16 | 0:16 0:26 | 0:26 0:22 0:26 0:28 | 0:28 0:38 | 0:38 0:32 0:38 0:48 | 0:48 0:58 | | ... | ... |
| II | Resetting of Expected Clock Time at Completion of Liquid Replacement 0:08 in Treatment Bath P1 | Ta Tb Tc Td | (0:00) | (0:00) (0:01) (0:08) 0:18 | 0:18 0:28 | 0:28 0:24 0:28 0:30 | 0:30 0:40 | 0:40 0:34 0:40 0:50 | 0:50 1:00 | | ... | ... |
| III | Resetting of Expected Clock time at Completion of Replacement 0:19 in Treatment Bath P1 | Ta Tb Tc Td | (0:00) | (0:00) (0:01) (0:08) (0:19) | 0:19 0:29 | 0:29 0:25 0:29 0:31 | 0:31 0:41 | 0:41 0:35 0:41 0:51 | 0:51 | | ... | ... |
| IV | At the Take-in Time of Next Object | | (0:22) | 0:22 + 10 min. <0:08 + 30 min. Treat. Possible | | | | | | | | |
| IV' | At the take-in Time of Next Object | | (0:30) | 0:32 + 10 min. >0:08 + 30 min. ↓ Liquid Adding over 0:35 Treatment Over 0:45 | | | | | | | | |

...

TABLE 2A

| Symbol in Table 2 | Meaning |
|---|---|
| (...) | Time in parenthesis means an actual time and the others means an expected time. |
| Ta | Arrival Clock Time |
| Tb | Liquid Replacement Starting Clock Time |
| Tc | Liquid Replacement Over Clock Time |
| Td | Treatment Over Clock Time |

On the other hand, treatment liquids in respective treatment baths have characteristic lifetimes and an allowed number of times for dipping (i.e., the number of uses) of the cassettes 6 in the same treatment liquid. In order to control the treatment liquids automatically, the lifetime and the allowed number of uses should be previously determined. The examples thereof are indicated in Table 3 and control of the treatment liquids in this embodiment is done in accordance with the data in Table 3.

TABLE 3

| Treatment | Life Time of Treatment Liquid | When Added | Allowed Number of Liquid | Uses of When Added |
|---|---|---|---|---|
| $P_1$ | 30 min. | Max. 40 min. | Twice | Max. 3 times |
| $P_2$ | 30 min. | — | Twice | — |
| $P_3$ | 30 min. | Max. 40 min. | Twice | Max. 3 times |

Table 3 also shows the allowed limits in cases where the treatment liquid is not totally replaced but added by the predetermined amount in order to substantially improve the lifetime and the number of uses. As described later, this embodiment can comply with such addition of the treatment liquids.

There are no data in Table 3 for the treatment bath $W_1 \sim W_4$, since they are used for water scouring. Pure water is constantly supplied to these treatment baths $W_1 \sim W_4$ and the excess of pure water is discharged as an overflow from the top ends of the baths. Therefore, there is no need of liquid replacement for these baths $W_1 \sim W_4$.

In this embodiment, the time period required for replacement of the treatment liquids in the treatment baths $P_1 \sim P_3$ is shown in Table 4, wherein, in addition to the draining time of the treatment liquid and the supplying time of new liquid, the time required for addition of the treatment liquid is shown for the treatment baths ($P_1$, $P_3$). This addition of liquid can substantially increase treatment liquid lifetime.

TABLE 4

| Treatment Bath | Treatment Liquid Draining Time | Time Required for Supplying New Liquid | Time Required for Adding the Treatment Liquid |
|---|---|---|---|
| $P_1$ | 3 min. | 6 min. | 3 min. |
| $P_2$ | 3 min. | 4 min. | — |
| $P_3$ | 3 min. | 6 min. | 3 min. |

C. Setting of Expected Arrival Clock Time of Cassette and Start of the Transportation Thereof The operation of this apparatus 1 will now be described. First, as an example of pre-setting the expected treatment clock times of the objects to be treated, now described are the setting of the expected clock time when the cassette 6 arrives at each treatment bath to start the dipping of the cassette 6 and the start of the transportation of the cassette 6 according to the set time. These processes are shown in FIG. 4 and the following description will be understood more clearly with reference thereto.

First, an operator brings the cassette 6 holding the semiconductor wafers 5 onto one end of the loader L in FIG. 1. This take-in action is achieved manually or automatically. After this action, the operator operates the keyboard 10 in order to select one of the treatment types indicated in Table 1, thereby the treatment order of the cassette 6 is determined. Also inputted by the operator are the lot number, the number of wafers and his own operator identifying number used to distinguish between his cassette and that taken-in by another operator. Then, the switch SWi is operated for confirmation.

When these data are input once, the data controller 21 calculates the expected arrival clock time of the cassette 6 to each treatment bath, the drier D, etc., on the basis of the data stored in the memory M, under the condition that the cassette 6 is successively dipped in the treatment baths according to the selected treatment type.

This calculation of the expected clock times can be achieved by using the data of the aforementioned time period required for treatment in each treatment bath (the third row of Table 2). As described later, it is arranged for the treatment bath $P_2$ and $P_3$ that the treatment liquid control such as the replacing thereof is automatically completed just on or before the arrival of the cassette 6 at the treatment baths $P_2$ and $P_3$. On the other hand, the taken-in cassette 6 arrives at the first treatment tank $P_1$ immediately, therefore, it is necessary to keep the cassette 6 waiting on the loader L until the first supply or replacement of the treatment liquid in the treatment bath $P_1$ is completed. To this end, the time period $t_0$ (in row for $P_1$ of Table 4) required for the liquid replacement in the treatment bath $P_1$ should be taken into consideration for estimating the arrival clock time of the cassette 6.

For obtaining the expected arrival time using these data, the treatment time periods ($t_1, t_2 \ldots$) in each treatment bath used for dipping according to the selected treatment type are successively added to the clock time $T_0$ when the cassette 6 is positioned on the the loader L and the switch SWi for confirming the take-in thereof is operated. In this calculation, the time period $t_0$ required for a replacement of the treatment liquid in the treatment bath $P_1$ is also taken into consideration, as described above.

Therefore, the expected clock time $T_n$ when the cassette 6 arrives at the n-th treatment bath is represented as follows:

$$T_n = T_0 + t_0 + t_1 + \ldots + t_{n-1} \quad (1)$$

However, it may be determined sometimes for the second and succeeding cassettes that the cassette 6 is dippable within the remaining lifetime of the already supplied treatment liquid in the treatment bath $P_1$, by comparing the data of Table 3 with the preceding replacing time of treatment liquid. In such cases, the cassette 6 can be immediately dipped without replacement of the treatment liquid in the treatment bath $P_1$, and therefore, the corresponding addition of the time $t_0$ is omitted from this arithmetic calculation of the equation (1).

An example of the expected arrival clock times obtained in such a manner is shown in the top line of the row "Process I" in Table 2 for the treatment type A in Table 1.

These data can be obtained in the following manner: First, it is estimated that if the transporting time of the cassette 6 between the different treatment baths or between the loader L and the next treatment bath is neglected and the take-in clock $T_0$ of the cassette 6 on the loader L is 0 o'clock 00 min. the cassette 6 arrives at the treatment bath $P_1$ in the same 0 o'clock 00 min.

However, there is no treatment liquid at this moment in the treatment bath $P_1$ and the cassette 6 should be kept waiting on the loader L for the time period ($t_0 = 6$ min.) for completing the supply of the treatment liquid in the treatment bath $P_1$. Therefore, the expected clock time of start of dipping in the treatment bath $P_1$ becomes 0 o'clock 06 min. (not shown in Table 2) and the addition of the succeeding treatment time period ($t_1 = 10$ min.) in the treatment bath $P_1$ gives the clock time 0 o'clock 16 min. in fourth line in the same row of Table 2 as the expected time when the treatment in the treatment bath $P_1$ is just completed. In this end, the expected arrival time of the cassette 6 at the next treatment bath $W_1$ is estimated as 0 o'clock 16 min.

Similarly, the expected arrival times to the other remaining treatment baths in the first line of the fourth row of Table 2 are obtained as follows;
$W_1$ - 0 o'clock 16 min.
$P_2$ - 0 o'clock 26 min.
$W_2$ - 0 o'clock 28 min.

Moreover, the expected clock times of start and completion of the replacement of the treatment liquid as shown in the second and third line of each row respectively are calculated from the following principle: If it is concluded in the process described later that the treatment liquid should be replaced before the arrival of the cassette 6 at the treatment bath, the expected clock time is calculated in such manner that the dipping start time of the cassette 6 in the treatment bath coincides with the replacing completion time of the treatment liquid, namely, the cassette 6 is dipped immediately after the replacing completion.

Therefore, it is supposed that for the treatment bath $P_2$, for example, the cassette 6 reaches the treatment bath $P_2$ expectedly at 0 o'clock 26 min. Therefore, the replacement of the treatment liquid of the treatment bath $P_2$ is started at 0 o'clock 22 min. earlier by the time period 4 min required for the replacement of the treatment liquid than 0 o'clock 26 min. and then completed at 0 o'clock 26 min.

The respective expected clock times thus obtained are set and stored in the memory M of the control circuit 20 and utilized for transporting and dipping the cassette 6 and replacing the treatment liquid as described later.

D. Resetting the Expected Arrival Clock Time of Cassette

Although the handling sequence of the cassette 6 and control timing of the treatment liquid are determined according to the expected arrival clock times set as mentioned above, the actual arrival clock time may sometimes deviate from the initially expected one, due to various reasons, for example;
(1) The transporting time of the cassette 6 from one treatment bath to another is neglected in the above arithmetic calculation.
(2) Although the replacing and adding processes of the treatment liquid are conducted in the optimum time zone corresponding to the expected arrival clock time of the cassette 6, unavoidable error may take place by momentary waiting of the cassette 6 due to the delay of such replacing of the treatment liquid.

Therefore, it is preferred for control with higher efficiency that the above expected clock time be reset according to the actual transporting and dipping progress of the cassette. This resetting may be conducted at any stage. In this embodiment, the resettings are tried at stages where the dipping in each treatment bath is started and completed, and the replacement described later of the treatment liquid is completed. However, there is no limitation for the timings thereof and a part of the above stages may be omitted or other stages may be used.

In the example of Table 2, the first presetting indicated as "Process II" is conducted at the stage where the supply of the treatment liquid in the treatment bath $P_1$ is completed. Namely, the control circuit 20 detects the actual supply completion of the treatment liquid as 0 o'clock 08 min. delayed by 2 min. in comparison with the initially expected clock time of 0 o'clock 06 min. and resets the expected arrival clock time to each succeeding treatment bath, according to the actual clock time of 0 o'clock 08 min.

This resetting may be conducted by a re-calculation of the expected clock times or by adding this delay time (2 min.) uniformly to each initially expected clock time. Moreover, the following "Process III" in Table 2 shows an example by the second resetting according to detection by a photoelectric sensor 25 that the cassette 6 is taken out of the treatment bath $P_1$ after the dipping in the treatment bath $P_1$ is actually completed at 0 o'clock 19 min. delayed by 1 min. from the initially expected clock time of 0 o'clock 18 min. The processes IV, IV' will be described later.

E. Replacing and Adding of the Treatment Liquid

The expected arrival clock time of the cassette 6 to each treatment bath is initially set and further reset appropriately at predetermined stages, while replacing and adding the treatment liquid are conducted according to the expected arrival clock time of the cassette 6.

In such processing, the replacement of the treament liquid may be started earlier by the time period required for the replacement than the expected arrival clock time obtained in the above mentioned manner. However, if treatment liquid is replaced each time before each cassette 6 arrives at the treatment bath, the treatment liquid should be drained and supplied frequently, although this wastes treatment liquids.

In order to avoid such waste, it is preferred that the relation between the data associated with the remaining lifetime of the treatment liquid and the number of uses thereof up to that time and the expected arrival time of the next cassette to the treatment bath be repeatedly determined at a time interval shorter than the lifetime thereof. By repeating such determinations, it can be judged whether or not a replacement is really required at that time. If it is not nessesary to replace the treatment liquid, the replacement is postponed. Furthermore, if only an addition of new treatment liquid can lengthen the lifetime enough to dip the next cassette, a supplement is also postponed and a predetermined amount of the treatment liquid is added to the treatment liquid currently held in the treatment bath. The above operation in view of only one treatment bath will be described with reference to the flow chart of FIG. 5.

Figure 5:
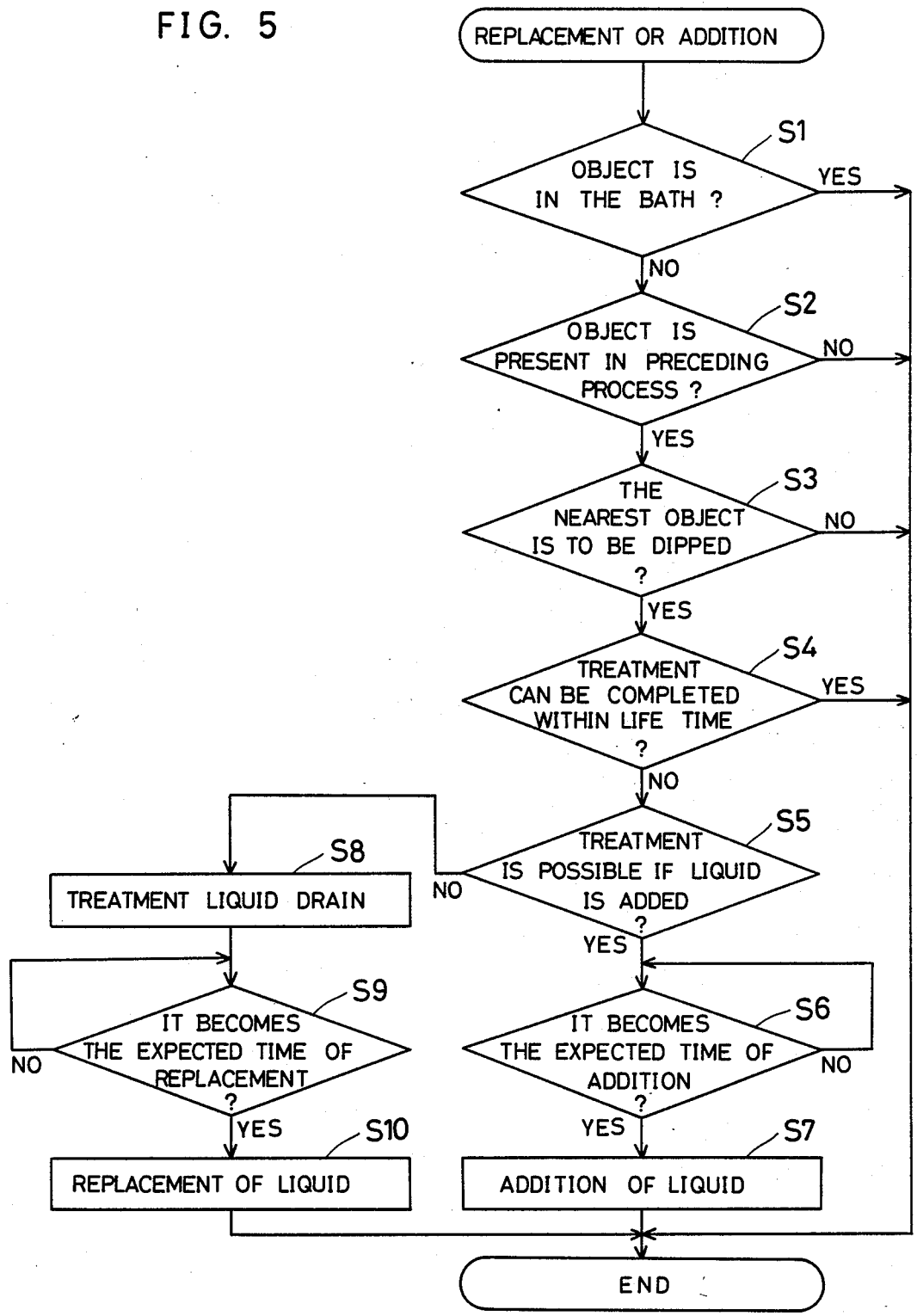
FIG. 5 is a flow chart showing replacement and addition of the treatment liquid.

In the step S1 of FIG. 5, it is judged whether the object to be treated (i.e., the cassette 6 holding the semiconductor wafers 5 in this embodiment) is present in the treatment bath. If present, replacement of the treatment liquid is impossible and the routine is completed without the replacement. If not present, it is checked in the step S2 whether the object to be treated is present in any one of the preceding processes. If not present, replacement of the treatment liquid is unnecessary at that time and the routine is completed accordingly. If the object to be treated is present at any preceding process, it is determined in step S3 whether the nearest object coming to the treatment bath is to be treated in the treatment bath by referring to the treatment type thereof.

This determination can be made with a survey of the data $D_1$, $D_2$, ... in the registers RL, $RP_1$ ... of FIG. 3 provided in the sequencer 22 corresponding to each treatment bath. Namely, the data $D_1$, $D_2$, ... representing the treatment type of the cassette 6 are transferred from the original registers to other registers to be addressed, corresponding to the transportation of the cassette 6 between the treatment baths. In other words, the treatment type of the cassette 6 found in each treatment bath is indicated by the data stored in these registers.

If it is determined in the step S3 that the nearest object is supposed to be dipped in the treatment bath, the routine is proceeds to step S4, where it is checked whether the treatment of the object can be completed within the remaining lifetime of the treatment liquid, by taking the actual clock time of the preceding replacement thereof into consideration. The aforementioned data of the expected arrival clock time and data of the time required for treatment are utilized in this determination.

If the treatment is allowed within the remainig lifetime, replacement of the treatment liquid is unnecessary and consequently the routine is completed. If treatment is impossible because of deterioration of the treatment liquid, the next step S5 determines whether the treatment liquid becomes usable by adding some amount of the treatment liquid. If possible, it is determined in the step S6 whether the current clock time is at or later than the expected clock time of the start of addition. When the actual clock time becomes the expected clock time, the predetermined quantity of the treatment liquid is added in the next step S7 and thus the routine is completed. The expected clock time of addition mentioned above means a clock time obtained by changing the word "replacing" to "adding" in the equation (2) described later.

On the other hand, if treatment through addition is impossible, the treatment liquid is drained in the step S8. It is checked in step S9 whether the current clock time is at or later than the expected clock time for replacing the treatment liquid. The expected clock times for replacing the treatment liquids are shown in the second line of each row succeeding the fourth row of Table 2 which is obtained by the following equation:

(Expected Clock Time of Replacing the Treatment Liquid)=(Expected Arrival Clock Time of The object to be Treated)−(Time Required For Replacing the Treatment Liquid)   (2)

The waiting state of the treatment bath continues up to the expected clock time for replacing the treatment liquid. When the expected clock time occurs, the routine proceeds to the step S10 to replace the treatment liquid and the temperature control thereof is conducted if necessary, completing the routine.

Thus, the cassette 6 can be dipped immediately when the supply of new liquid is over, preventing waste of the treatment liquid cased by deterioration thereof.

Though not shown in FIG. 5, the number of uses of the treatment liquid may be also determined. Namely, processing similar to the steps S5 to S9 is conducted when it is determined that the dippings corresponding to the allowed number of uses have been already conducted.

Furthermore, if the take-in time interval of the cassette 6 is too short and the next cassette 6 reaches the treatment bath during replacement of the treatment liquid, the cassette 6 is kept waiting just before the treatment bath.

In this embodiment, the aforementioned determination for replacement is conducted every time each aforementioned expected arrival clock time is reset. The resetting time interval of the expected clock times is about 10 min. and therefore, the determination is repeated with the time interval shorter than the lifetime (30 min.) of the treatment liquid as mentioned above.

The processes IV and IV' in Table 2 are examples of the aforementioned determinations for replacing the treatment liquid when a new cassette taken-in following the cassette as shown in the processes I~III enters the treatment bath $P_1$.

As shown in the process IV, if this cassette is transported at 0 o'clock 22 min. onto the loader L, the time for completing the dipping becomes 0 o'clock 22 min. + 10 min. = 0 o'clock 23 min. even if the cassette is directly dipped in the treatment bath. Therefore, the dipping is expected to be completed before 0 o'clock 38 min. when the lifetime of 30 min. is over from the completion of the last replacement of 0 o'clock 08 min. To this end, it is concluded that the direct dipping should be executed without replacement of the treatment liquid.

On the other hand, as shown in process IV', if the cassette 6 is taken-in at 0 o'clock 32 min. it is obtained from the similar calculation that the time of the dipping completion is expected to be beyond the lifetime of the treatment liquid. However, it is possible to compensate for this deviation by adding the treatment liquid. Therefore, the cassette 6 is kept waiting on the loader L until the addition of the treatment liquid is over and then the dipping is started.

FIG. 6 shows the controlled conditions of the treatment liquids thus obtained, together with loci $K_1$, $K_2$ and $K_3$ of respective cassettes for a case where the casettes corresponding to processing type B, A in Table 1 are taken-in successively after the cassette corresponding to treatment type A.

In FIG. 6, the supply (Su) of the treatment liquid, the temperature control (He) thereof, the drain (Dr) thereof, the addition (Ad) thereof and the flushing (Fl) thereof are considered as the treatment liquid control, the respective timings being determined according to the aforementioned calculations.

The cassette shown by the locus $K_1$ corresponds to the cassette indicated by the processes I~III of Table 2, while the cassettes shown by the loci $K_2'$, $K_2$ correspond to the cassettes indicated by the processes IV, IV' of Table 2 respectively. $K_1'$ indicates the locus when it is supposed that a cassette of the treatment type A is taken-in following the cassette of locus $K_1$.

For the cassette of the treatment type (B) shown by the locus $K_2'$, for example, it is clearly understood that the dipping is judged as completable within the lifetime of the treatment liquid in the treatment bath $P_1$, by taking the expected arrival clock time of that cassette to the treatment bath $P_1$ and the time period required for the dipping thereof into consideration. Thus replacement of the treatment liquid is postponed.

F. Flow of Cassettes and Control of Competing Cassettes

Under the aforementioned control, the cassette 6 is transported successively into the respective treatment baths $P_1$, $W_1$, ... $W_4$, subjected to the surface treatments of the selected type and then delivered to the drier D. In parallel with the flow of the cassette 6, the treatment liquids of the treatment baths $P_1 \sim P_3$ are replaced at optimum times through automatic control of the solenoid valve 23 shown in FIG. 2.

The cassette 6 is dried at the drier D by a hot air or centrifugal dehydration system and fed into the unloader UL, which trasfers the cassette 6 to the take-out position thereof. At the same time, information such as the lot number of the cassette 6 and the machine number of the succeeding process is displayed on the CRT 9b. The operator checks the information and then takes-out the cassette 6. The switch SWo is used for the purpose of this check.

In multiple processing like this embodiment, if a cassette of the treatment type A in Table 1 is followed by another cassette of the treatment types B~E, the latter may sometimes catch up with the former during the dipping treatment, because the number of the treatment baths to be dipped is fewer for the latter than that for the former. In such a competing case, the latter cassette is controlled to be kept waiting in the nearest water scouring bath positioned just before the treatment bath and transferred after the former cassette is moved into the next treatment bath.

As clearly understood from FIG. 1 or Table 1, the wafer scouring baths $W_1 \sim W_4$ are located just behind the chemical treatment baths $P_1 \sim P_3$. Therefore, any cassette always travels to any water scouring bath after entering the chemical treatment baths, and such waiting in the water scouring bath is allowed at any time.

G. A Modified Embodiment

As mentioned above, it is possible in the embodiment according to the present invention to transport the successively take-in cassettes at the minimum timings, which is determined, taking the relation of the flows of the cassettes and of the treatment liquid control into consideration. As a result, the treatment liquid control is conducted most effectively. This invention is not limited, however, to the above embodiment only and the following modifications, for example, are also allowed.

(1) The multiple processing of A~E as shown Table 1 is assumed in the above embodiment, however, surface treatment based on a single treatment type can be handled without any problem, wherein the selecting operation of the treatment types and the consequent mutual control of the competing cassettes of the different treatment types are not required.

(2) The aforementioned control circuit 20 may be connected to a properly progrommed host computer.

(3) It is allowed to combine surface treatment in the treatment baths with the aforementioned drying process and others. Of course, in the above embodiment, temperature control and preparation of the treatment liquids which accompany these treatments are simultaneously excuted with the surface treatments themselves.

(4) The types of the objects to be treated and/or the purposes of the surface treatments are not limited in the present invention. For example, the present invention can be applied to several surface treatment such as plating in addition to surface treatment of glass support plates for photoetchings. A plurality of the treatment baths is not necessarily required; only one bath sometimes is enough for applying the present invention.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A surface treatment method for transporting a number of objects which are to be subjected to different series of treatment steps in a treatment bath train containing a plurality of treatment baths and serially dipping each of said objects in selected treatment liquids supplied in said treatment baths, for predetermined times respectively, each of said objects being serially dipped in said selected treatment liquids in a dipping order which is previously determined according to a treatment program for each of said objects individually, said surface treatment method comprising the steps of:

determining a reference clock time at which a particular one of said objects is actually brought into said treatment bath train;

calculating for a particular one of said treatment baths an expected clock time at which said particular object is expected to arrive at said particular treatment bath on the basis of said reference clock time and a predetermined length of time that elapses for said particular object to be treated in at least one preceding treatment bath in said dipping order before said particular object arrives at said particular treatment bath, said expected clock time being calculated before said particular object arrives at said one treatment bath; and transporting said particular object along said treatment bath train and serially dipping said particular object in said treatment liquids in said treatment baths while controlling a characteristic of each of said treatment liquids on the basis of said expected clock time through the steps of (a) calculating a lifetime terminating clock time after which a known lifetime of said treatment liquid currently available in said particular treatment bath is expected to be over, (b) comparing said lifetime terminating clock time with said expected clock time, (c) counting a number of dippings indicating how many of said objects have been dipped in said treatment liquid currently available in said particular treatment bath, (d) comparing said number of dippings with a known allowed dipping number indicating how many more of said objects can be effectively treated by said treatment liquid currently available in said particular treatment bath without replacement of at least a portion thereof, (e) determining on the basis of said steps (b) and (d) whether said lifetime terminating clock time will be over, and whether said number of dippings will exceed said allowed dipping number, if said particular object is dipped in said treatment liquid currently available in said particular treatment bath, and (f) replacing at least a portion of said treatment liquid in said treatment bath in accordance with the determination made in said step (e).

2. A surface treatment method in accordance with claim 1, wherein:

(b-1) said expected clock time is calculated and preset at a time when said one object is taken-in into the bath train at an object feeding position thereof on the basis of said predetermined treatment time period and a feeding clock time which is a clock time when said one object is taken-in at said object feeding position, said reference clock time being said feeding clock time, and (b-2) said expected clock time is re-calculated and reset when said one object reaches a predetermined processing stage in a surface treatment using said treatment bath train by determining the clock time at which said one object actually reaches said predetermined processing stage and correcting on the basis of said clock time the expected clock time which was preset in said step (b-1).

3. A surface treatment method in accordance with claim 2, wherein:

said predetermined processing stage includes at least one of (a) a stage when the dipping in each treatment bath is started, (b) a stage when the dipping in each treatment bath is completed, and (c) a stage when control of the treatment liquid in each treatment bath is completed before the arrival of said object thereat.

4. A surface treatment method in accordance with claim 1, wherein:

said replacing of said treatment liquid is conducted in such a manner that said object is dipped in the corresponding treatment bath immediately after the completion of said replacement of a portion thereof.

* * * * *